(12) United States Patent
Wang et al.

(10) Patent No.: US 11,575,405 B1
(45) Date of Patent: Feb. 7, 2023

(54) METHOD FOR CORRECTING 1 PULSE PER SECOND SIGNAL AND TIMING RECEIVER

(71) Applicant: Ufi Space co., Ltd., New Taipei (TW)

(72) Inventors: Yu-Min Wang, Taoyuan (TW); Yu Chih Wang, Pingtung County (TW)

(73) Assignee: Ufi Space co., Ltd., New Taipei (TW)

( * ) Notice: Subject to any disclaimer, the term of this patent is extended or adjusted under 35 U.S.C. 154(b) by 0 days.

(21) Appl. No.: 17/530,475

(22) Filed: Nov. 19, 2021

(30) Foreign Application Priority Data

Nov. 8, 2021 (TW) .................................. 110141567

(51) Int. Cl.
| | |
|---|---|
| *H04L 7/00* | (2006.01) |
| *H04L 25/00* | (2006.01) |
| *H04L 25/40* | (2006.01) |
| *H04B 1/7087* | (2011.01) |
| *H04L 7/06* | (2006.01) |

(52) U.S. Cl.
CPC ............. *H04B 1/7087* (2013.01); *H04L 7/06* (2013.01); *H04B 2201/7073* (2013.01)

(58) Field of Classification Search
CPC .......... H04B 1/7087; H04B 2201/7073; H04B 7/2693; H04L 7/06; G06F 1/12; G06F 1/14; G06F 1/04; H03L 7/07; H04J 3/0697; H04J 3/0644; H04J 3/0655; H03B 17/00
USPC .......................... 375/356, 371, 372, 373, 375
See application file for complete search history.

(56) References Cited

U.S. PATENT DOCUMENTS

| | | | | |
|---|---|---|---|---|
| 7,249,272 | B1 * | 7/2007 | Wardrop ............... | H04J 3/0644 713/400 |
| 11,442,497 | B1 * | 9/2022 | Gregory .................... | G06F 1/12 |
| 2007/0247292 | A1 * | 10/2007 | Joung .................. | H04B 7/2693 340/440 |
| 2009/0276542 | A1 * | 11/2009 | Aweya ...................... | H03L 7/08 709/248 |
| 2010/0100759 | A1 * | 4/2010 | Blixt ......................... | G06F 1/14 713/502 |
| 2011/0161701 | A1 * | 6/2011 | Blixt ...................... | H04J 3/0697 713/400 |
| 2011/0286560 | A1 * | 11/2011 | Pignatelli .............. | H04J 3/0655 375/356 |
| 2012/0005517 | A1 * | 1/2012 | Foster ...................... | G06F 1/12 713/500 |
| 2014/0136877 | A1 * | 5/2014 | Engler ..................... | G06F 1/04 713/600 |
| 2017/0187384 | A1 * | 6/2017 | Shimada ................ | H03B 17/00 |

FOREIGN PATENT DOCUMENTS

| | | |
|---|---|---|
| CN | 102084314 | 6/2011 |
| CN | 110658498 | 1/2020 |
| CN | 112506268 | 3/2021 |

OTHER PUBLICATIONS

"Office Action of Taiwan Counterpart Application", dated Jul. 5, 2022, p. 1-p. 8.

\* cited by examiner

*Primary Examiner* — Phuong Phu
(74) *Attorney, Agent, or Firm* — JCIPRNET

(57) ABSTRACT

The disclosure provides a method for correcting a 1 pulse per second (1PPS) signal and a timing receiver. In the embodiments of the disclosure, the proposed method allows the timing receiver to provide a corrected 1PPS signal with better quality to back-end slave devices, thereby ensuring that the synchronization effect of the slave devices is not overly affected by jitter in a single 1PPS signal.

20 Claims, 3 Drawing Sheets

METHOD FOR CORRECTING 1 PULSE PER SECOND SIGNAL AND TIMING RECEIVER

CROSS-REFERENCE TO RELATED APPLICATION

This application claims the priority benefit of Taiwan application serial no. 110141567, filed on Nov. 8, 2021. The entirety of the above-mentioned patent application is hereby incorporated by reference herein and made a part of this specification.

BACKGROUND

Technical Field

The disclosure relates to a mechanism for correcting a synchronization signal, and in particular to a method for correcting a 1 pulse per second signal and a timing receiver.

Description of Related Art

Referring to FIG. 1, FIG. 1 is a schematic diagram of the operation of a conventional global navigation satellite system (GNSS). As shown in FIG. 1, when a GNSS receiver receives a satellite signal from one or more satellites, a 1 pulse per second (1PPS) signal and time of date (ToD) information may be obtained by decoding the satellite signal. Next, the GNSS receiver may provide the obtained 1PPS signal and ToD information to other slave devices (such as various distributed nodes and/or base stations, etc.) to allow these slave devices to respectively perform phase and time synchronization according to the 1PPS signal and ToD information.

However, when the GNSS receiver receives the satellite signal, the 1PPS signal obtained by the GNSS receiver often has a jitter of tens to thousands of nanoseconds due to climate interference (for example, only satellite signals from a few satellites may be received due to cloud cover) or poor reception angles. In this case, the related slave device is not able to accurately perform the above synchronization operations.

In addition, when the GNSS receiver cannot receive the satellite signal of any satellite for some reason, the 1PPS signal it provides may be seriously misaligned within a short time (for example, within 15 minutes).

SUMMARY

In view of the above, the disclosure provides a method for correcting a 1 pulse per second signal and a timing receiver, which are used to address the above technical issues.

The disclosure provides a method for correcting a 1 pulse per second signal, adapted for a timing receiver, including the following. A clock signal is received from a first counter, and a first count value is accumulated based on the clock signal. In response to receiving an i-th 1 pulse per second signal, the first count value corresponding to the i-th 1 pulse per second signal is output, and the first counter is reset, where i is an index value. A difference value between a reference value and the first count value corresponding to the i-th 1 pulse per second signal is obtained, and the difference value is stored to a queue; the queue stores multiple specific difference values, the specific difference values include a difference value corresponding to the i-th 1 pulse per second signal to a difference value corresponding to an i−N+1-th 1 pulse per second signal, and N is a depth of the queue. Based on the specific difference values and the reference value, a reference count value corresponding to the i-th 1 pulse per second signal is generated, and a signal generating circuit counts down from the reference count value based on the clock signal. In response to determining that the signal generating circuit counts down to a default value, a corrected 1 pulse per second signal is output.

The disclosure provides a timing receiver including a first counter, a comparator, a queue, an estimation circuit, and a signal generating circuit. The first counter is configured to: receive a clock signal, and accumulate a first count value based on the clock signal; and in response to receiving an i-th 1 pulse per second signal, output the first count value corresponding to the i-th 1 pulse per second signal, and reset the first counter, wherein i is an index value. The comparator is coupled to the first counter, and obtains a difference value between a reference value and the first count value corresponding to the i-th 1 pulse per second signal, and stores the difference value to a queue. The queue is coupled to the comparator, and stores multiple specific difference values; the specific difference values include the difference value corresponding to the i-th 1 pulse per second signal to a difference value corresponding to the i−N+1-th 1 pulse per second signal, and N is a depth of the queue. The estimation circuit is coupled to the comparator and the queue, and generates a reference count value corresponding to the i-th 1 pulse per second signal based on the specific difference values and the reference value. The signal generating circuit is coupled to the estimation circuit, and is configured to: count down from the reference count value based on the clock signal; and in response to determining that the signal generating circuit counts down to a default value, outputting a corrected 1 pulse per second signal.

DESCRIPTION OF THE EMBODIMENTS

Figure 2:
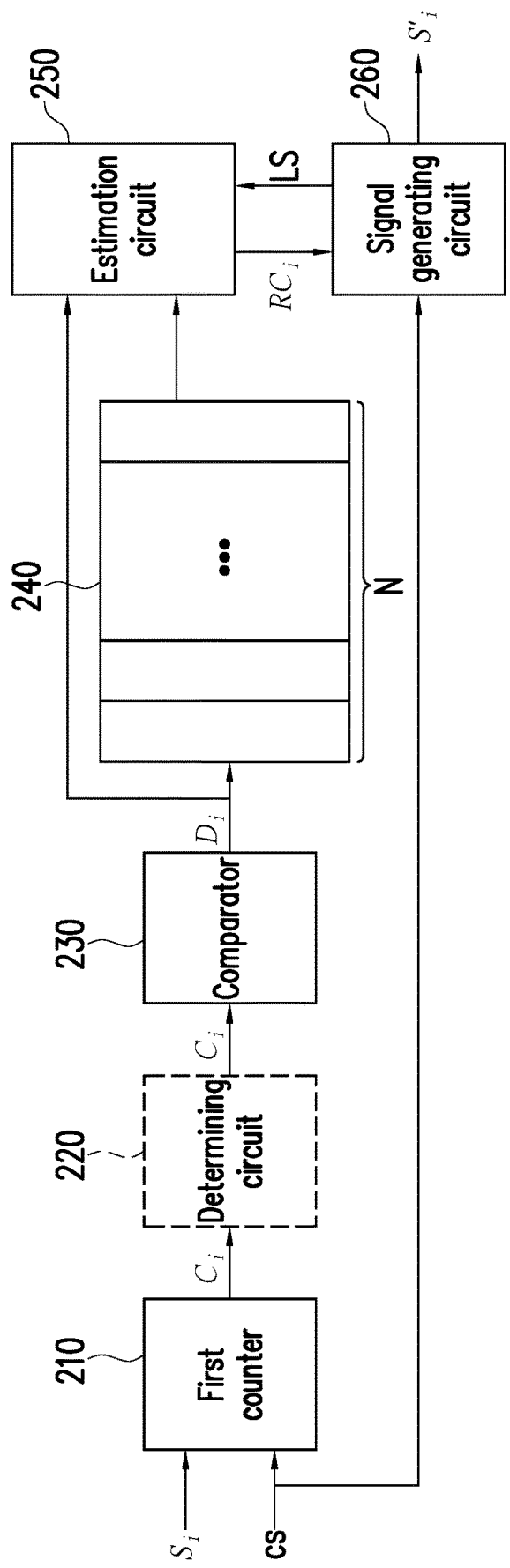
FIG. 2 illustrates a schematic diagram of a timing receiver according to an embodiment of the disclosure.

Referring to FIG. 2, FIG. 2 illustrates a schematic diagram of a timing receiver according to an embodiment of the disclosure. In FIG. 2, a timing receiver 200 includes a first counter 210, a comparator 230, a queue 240, an estimation circuit 250, and a signal generating circuit 260.

In the embodiment of the disclosure, the first counter 210, the comparator 230, the queue 240, the estimation circuit 250, and the signal generating circuit 260 may work together to implement a 1 pulse per second (1PPS) signal correction method proposed by the disclosure. The details are as follows.

Figure 3:
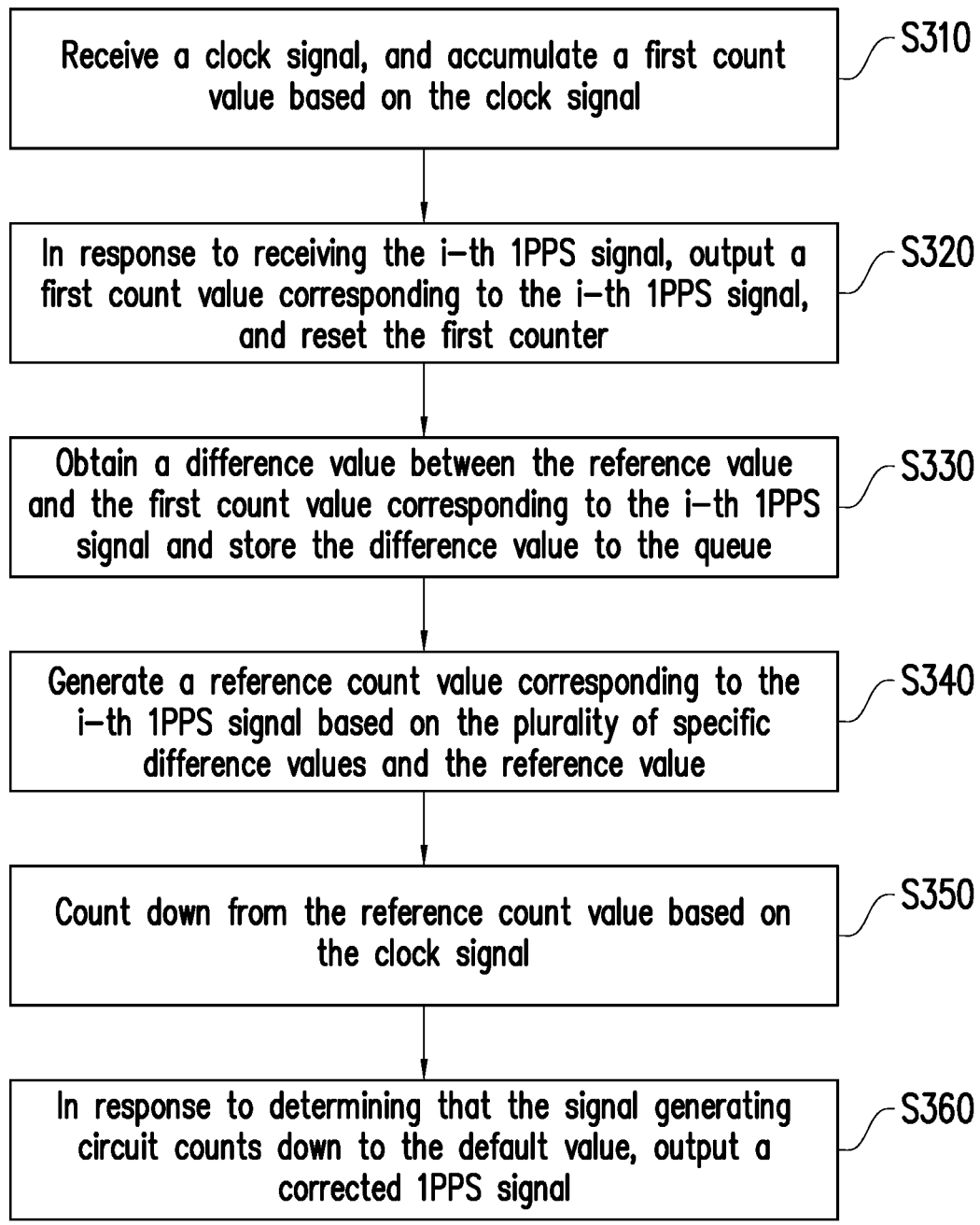
FIG. 3 illustrates a flow chart of a method for correcting a 1 pulse per second (1PPS) signal according to an embodiment of the disclosure.

Referring to FIG. 3, FIG. 3 illustrates a flow chart of a method for correcting a 1 pulse per second (1PPS) signal according to an embodiment of the disclosure. The method of this embodiment may be executed by the timing receiver 200 shown in FIG. 2. The following describes the details of each step in FIG. 3 with the elements shown in FIG. 2.

First, in step S310, the first counter 210 may be used to receive a clock signal CS, and may accumulate a first count value based on the clock signal CS. In other embodiment, the clock signal CS may be provided by a corresponding clock source, and the clock source is, for example, an oven controlled crystal oscillator (OCXO), or other precise and controllable clock signal generators, but is not limited thereto.

In an embodiment, the above-mentioned clock source may provide the clock signal CS that includes a plurality of pulses based on a set reference frequency, and the time difference between two pulses is the countdown of the reference frequency. For ease of description, the following assumes that the reference frequency of the clock source is 125 MHz, but possible implementations of the disclosure are not limited thereto. When the reference frequency of the clock source is assumed to be 125 MHz, the time difference between two pulses of the clock signal CS is 8 ns (that is, 1/125 M second).

In an embodiment, the first counter 210 may accumulate its count value (that is, the first count value) when it detects one of the pulses. That is, when the reference frequency of the clock source is 125 MHz, the first counter 210 increases the first count value by one every 8 ns.

Figure 1:
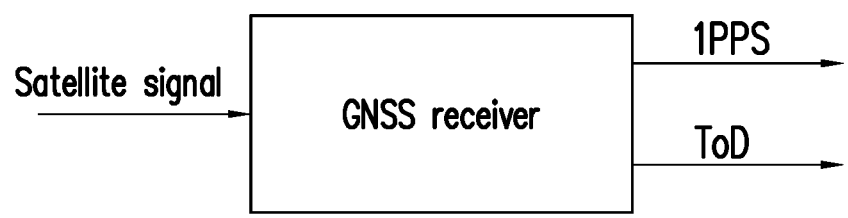
FIG. 1 is a schematic diagram of the operation of a conventional global navigation satellite system (GNSS).

In an embodiment, the first counter 210 may be used to receive a plurality of continuous 1PPS signals from, for example, the GNSS receiver of FIG. 1, and an i-th 1PPS signal therein may be expressed as $S_i$. Correspondingly, in step S320, in response to the first counter 210 receiving the i-th 1PPS signal $S_i$, the first counter 210 may output a first count value $C_i$ corresponding to the i-th 1PPS signal, and reset the first counter 210.

In an embodiment, the first counter 210 may start to accumulate the first count value when the i-1-th 1PPS signal is received, for example. That is, each time the first counter 210 receives one 1PPS signal, the first counter 210 accumulates the first count value from 0, and outputs the first count value when it receives the next 1PPS signal, and accumulates the first count value from 0 again.

As mentioned above, the first counter 210 accumulates 1 every 8 ns, so the accumulated first count value may be understood as corresponding to the time difference between two consecutive 1PPS signals. In other words, the first count value $C_i$ corresponding to the i-th 1PPS signal $S_i$ output by the first counter 210 in step S320 may be understood as corresponding to the time difference between an i-1-th 1PPS signal $S_{i-1}$ and the i-th 1PPS signal $S_i$.

Specifically, the GNSS receiver in an ideal state may provide one 1PPS signal to the first counter 210 per second; that is, the time difference between two consecutive 1PPS signals should be exactly 1 second, and the corresponding first count value should be 125,000,000. However, since these 1PPS signals may have the previously mentioned jitter, the time difference between two consecutive 1PPS signals from the GNSS receiver may not be exactly 1 second. In other words, the first count value may not be exactly 125,000,000.

In this case, the first counter 210 may be used to estimate the time difference between two consecutive 1PPS signals, so that the timing receiver 200 may perform subsequent operations.

In an embodiment, the first counter 210 may be coupled to the comparator 230, and the first counter 210 may directly output the first count value $C_i$ corresponding to the i-th 1PPS signal $S_i$ to the comparator 230, so that the comparator 230 may perform subsequent operations accordingly.

In another embodiment, the timing receiver 200 may further include a determining circuit 220 coupled between the first counter 210 and the comparator 230. In an embodiment, the determining circuit 220 may determine whether the first count value is between a lower limit and an upper limit. In other embodiments, the designer may set the lower limit and the upper limit to a value corresponding to a normal first count value range according to requirements, but the disclosure is not limited thereto.

In an embodiment, the determining circuit 220 determining that the first count value $C_i$ is between the lower limit and the upper limit means that the value of the first count value $C_i$ is reasonable. In this case, the determining circuit 220 may output the first count value $C_i$ to the comparator 230 so that the comparator 230 may perform subsequent operations accordingly.

On the other hand, the determining circuit 220 determining that the first count value $C_i$ is not between the lower limit and the upper limit means that the value of the first count value $C_i$ is unreasonable. In this case, the determining circuit 220 may ignore the first count value $C_i$. That is, the determining circuit 220 may not output the first count value $C_i$ to the comparator 230, but the disclosure is not limited thereto.

After the comparator 230 obtains the first count value $C_i$, in step S330, the comparator 230 obtains a difference value $D_i$ between the reference value and the first count value $C_i$ corresponding to the i-th 1PPS signal $S_i$, and stores the difference value $D_i$ to the queue 240.

In an embodiment, the above-mentioned reference value may be set to be equal to the reference frequency of the clock signal CS. That is, when the reference frequency is assumed to be 125 MHz, the reference value may be set to 125,000,000.

In an embodiment, the comparator 230 may subtract the reference value from the first count value $C_i$ to obtain the difference value $D_i$. In the embodiment of the disclosure, the difference value $D_i$ may be expressed in K-bit data, where the first bit (for example, the most significant bit (MSB)) of the K-bit data may be used to indicate the sign of the difference value $D_i$. For example, if the difference value $D_i$ is positive, its MSB may be recorded as 0; if the difference value $D_i$ is negative, its MSB may be recorded as 1, but the disclosure is not limited thereto.

In different embodiments, the value of K may be selected according to the needs of the designer, and the following will take the case of K being equal to 29 as an example, but the disclosure is not limited thereto. For example, assuming that the first count value $C_i$ is 125,000,007, the corresponding difference value $D_i$ is, for example, 7 (that is, 125,000,007-125,000,000). In this case, the difference value $D_i$ may be correspondingly represented as 29-bit data, where the MSB of the data may be represented as "1'b0" (b represents binary), and the remaining 28 bits may be represented as "28'h0000007" (h represents hexadecimal).

For another example, assuming that the first count value $C_i$ is 124,999,993, the corresponding difference value $D_i$ is, for example, −7 (that is, 124,999,993-125,000,000). In this case, the difference value $D_i$ may be correspondingly represented as 29-bit data, where the MSB of the data may be represented as "1'b1" (b represents binary), and the remaining 28 bits may be represented as "28'h0000007" (h represents hexadecimal), but the disclosure is not limited thereto.

In another embodiment, the comparator 230 may subtract the first count value $C_i$ from the reference value to obtain the difference value $D_i$, and the corresponding data representation method may be adjusted according to the above teaching, but the disclosure is not limited thereto.

In the embodiment of the disclosure, the queue 240 coupled to the comparator 230 is, for example, a first-in-first-out (FIFO) queue, and its depth is, for example, N (N is a positive integer). In an embodiment, the queue 240 may be understood as including N (for example, 1024) data storage locations (indicated by Diff[0] to Diff[N−1]), and Diff[0] to Diff[N−1] may respectively be used to store N specific difference values.

In some embodiments, the N specific difference values, for example, include the difference value $D_i$ corresponding to the i-th 1PPS signal $S_i$ to a difference value $D_{i-N+1}$ corresponding to an i−N+1-th 1PPS signal $S_{i-N+1}$.

In an embodiment, before the comparator 230 outputs the difference value $D_i$ to the queue 240, Diff[0] to Diff[N−1] of the queue 240 may respectively store a difference value $D_{i-1}$ corresponding to the i−1-th 1PPS signal $S_{i-1}$ to a difference value $D_{i-N}$ corresponding to the i-N-th 1PPS signal $S_{i-N}$. However, after the comparator 230 outputs the difference value $D_i$ to the queue 240, since the queue 240 is a FIFO queue, the difference value $D_{i-N}$ is removed from the queue 240, so that Diff[0] to Diff[N−1] of the queue 240 change to respectively store the difference value $D_i$ corresponding to the i−1-th 1PPS signal $S_{i-1}$ to the difference value $D_{i-N+1}$ corresponding to the i-N+1-th 1PPS signal $S_{i-N+1}$.

Next, in step S340, the estimation circuit 250 coupled to the queue 240 generates a reference count value $RC_i$ corresponding to the i-th 1PPS signal $S_i$ based on the plurality of specific difference values and the reference value.

In an embodiment, the estimation circuit 250 may obtain the statistical characteristics values of the above-mentioned N specific difference values (that is, the difference values $D_i$ to $D_{i-N+1}$) In an embodiment, the estimation circuit 250 may obtain, for example, the average value (that is, $(D_i + \ldots + D_{i-N+1})$N) of the difference values $D_i$ to $D_{i-N+1}$ as the above-mentioned statistical characteristics value, but the disclosure is not limited thereto. Next, the estimation circuit 250 may add the statistical characteristics value and the reference value (for example, 125,000,000) to generate the reference count value $RC_i$.

In another embodiment, the estimation circuit 250 may first obtain a reference count value $RC_{i-1}$ corresponding to the i−1-th 1PPS signal $S_{i-1}$. Next, the estimation circuit 250 may obtain the difference value $D_i$ corresponding to the i-th 1PPS signal $S_i$ and the difference value $D_{i-N}$ corresponding to the i-N-th 1PPS signal $S_{i-N}$, and determine a correction factor accordingly. Next, the estimation circuit 250 may add the correction factor to the reference count value $RC_{i-1}$ corresponding to the i−1-th 1PPS signal $S_{i-1}$ to generate the reference count value $RC_i$ corresponding to the i-th 1PPS signal $S_i$.

In an embodiment, in the process of determining the above-mentioned correction factor, the estimation circuit 250 may subtract the difference value $D_{i-N}$ corresponding to the i-N-th 1PPS signal $S_{i-N}$ from the difference value $D_i$ corresponding to the i-th 1PPS signal $S_i$ to generate the reference difference value. Next, the estimation circuit 250 may divide the reference difference value by N to generate the above-mentioned correction factor (that is, $(D_i - D_{i-N})/N$), but the disclosure is not limited thereto.

Next, in step S350, the signal generating circuit 260 coupled to the estimation circuit 250 counts down from the reference count value $RC_i$ based on the clock signal CS.

In step S360, in response to determining that the signal generating circuit 260 counts down to the default value (for example, 0), the signal generating circuit 260 outputs a corrected 1PPS signal $S'_i$.

In an embodiment, the signal generating circuit 260 may transmit a load signal LS to the estimation circuit 250 when outputting the i−1-th 1PPS signal $S_{i-1}$, and the estimation circuit 250, in response to the load signal LS, may load the reference count value $RC_i$ into the signal generating circuit 260 as a second count value of the signal generating circuit 260. In an embodiment, the signal generating circuit 260 may include a down counter for counting down from the reference count value $RC_i$.

In an embodiment, in response to the signal generating circuit 260 detecting one of the pulses of the clock signal CS, the signal generating circuit 260 may decrease the second count value progressively. That is, when the reference frequency of the clock source is 125 MHz, the signal generating circuit 260 decreases the second count value by one every 8 ns.

In addition, when the second count value is decreased to the default value (for example, 0), the signal generating circuit 260 may output the corrected 1PPS signal $S'_i$ accordingly. In other embodiments, the signal generating circuit 260 may output the corrected 1PPS signal $S'_i$ to the various slave devices (such as various distributed nodes and/or base stations, etc.) mentioned earlier to allow these slave devices to perform phase synchronization according to the corrected 1PPS signal $S'_i$, thereby achieving a better synchronization effect.

Specifically, as mentioned earlier, since jitter may exist in the i-th 1PPS signal $S_i$, if the above-mentioned slave device directly performs phase synchronization based on the i-th 1PPS signal $S_i$, a synchronization effect with lower accuracy may be caused.

However, through the method proposed in the embodiment of the disclosure, the comparator 230 may represent the degree of deviation of the time difference between two consecutive 1PPS signals from 1 second as a corresponding difference value. Next, through the operation performed by the estimation circuit 250, the difference value corresponding to N consecutive 1PPS signals may be smoothed, and then the smoothed difference value and the reference value may be added to generate the reference count value $RC_i$, and this reference count value $RC_i$ allows the signal generating circuit 260 to output the corrected 1PPS signal $S'_i$ at a time point different from the i-th 1PPS signal $S_i$. In this way, the synchronization effect of the slave device is not overly affected by the jitter in the i-th 1PPS signal $S_i$.

In addition, for some situations where the 1PPS signal cannot be received from the GNSS receiver, the method of the disclosure may provide a certain degree of holdover effect. For example, when the GNSS receiver cannot provide the 1PPS signal to the timing receiver 200 because it cannot receive the satellite signal of any satellite, the timing receiver 200 may still run continuously for about N seconds, so as to ensure that the slave device may still be synchronized within the time interval of N seconds.

In summary, the method of the disclosure allows the timing receiver to provide a corrected 1PPS signal of better quality to the back-end slave device, thereby ensuring that the synchronization effect of the slave device is not overly affected by the jitter in a single 1PPS signal.

Although the disclosure has been disclosed in the above by way of embodiments, the embodiments are not intended to limit the disclosure. Those with ordinary knowledge in the technical field can make various changes and modifications without departing from the spirit and scope of the disclosure. Therefore, the protection scope of the disclosure is subject to the scope of the appended claims.

What is claimed is:

1. A method for correcting a 1 pulse per second signal, adapted for a timing receiver, comprising:
  receiving a clock signal from a first counter, and accumulating a first count value based on the clock signal;

in response to receiving an i-th 1 pulse per second signal, outputting the first count value corresponding to the i-th 1 pulse per second signal, and resetting the first counter, where i is an index value;

obtaining a difference value between a reference value and the first count value corresponding to the i-th 1 pulse per second signal, and storing the difference value to a queue, wherein the queue stores a plurality of specific difference values, the specific difference values comprise a difference value corresponding to the i-th 1 pulse per second signal to a difference value corresponding to an i−N+1-th 1 pulse per second signal, and N is a depth of the queue;

based on the specific difference values and the reference value, generating a reference count value corresponding to the i-th 1 pulse per second signal, and counting down from the reference count value by a signal generating circuit based on the clock signal; and in response to determining that the signal generating circuit counts down to a default value, outputting a corrected 1 pulse per second signal.

2. The method according to claim 1, wherein the clock signal comprises a plurality of pulses, and accumulating the first count value based on the clock signal comprises:

in response to detecting one of the pulses of the clock signal, accumulating the first count value.

3. The method according to claim 1, wherein the clock signal has a reference frequency, and the reference value is equal to the reference frequency.

4. The method according to claim 1, wherein after outputting the first count value corresponding to the i-th 1 pulse per second signal, the method further comprises:

in response to determining that the first count value is between a lower limit and an upper limit, obtaining the difference value between the reference value and the first count value corresponding to the i-th 1 pulse per second signal; and in response to determining that the first count value is not between the lower limit and the upper limit, ignoring the first count value.

5. The method according to claim 1, wherein the queue is a first-in-first-out queue.

6. The method according to claim 1, wherein generating the reference count value corresponding to the i-th 1 pulse per second signal based on the specific difference values and the reference value comprises:

obtaining a statistical characteristics value of the specific difference values; and adding the statistical characteristics value to the reference value to generate the reference count value.

7. The method according to claim 6, wherein the statistical characteristics value of the specific difference values is an average value of the specific difference values.

8. The method according to claim 1, wherein generating the reference count value corresponding to the i-th 1 pulse per second signal based on the specific difference values and the reference value comprises:

obtaining a reference count value corresponding to an i−1-th 1 pulse per second signal;

obtaining the difference value corresponding to the i-th 1 pulse per second signal and a difference value corresponding to an i−N-th 1 pulse per second signal, and determining a correction factor accordingly; and adding the correction factor to the reference count value corresponding to the i−1-th 1 pulse per second signal to generate the reference count value corresponding to the i-th 1 pulse per second signal.

9. The method according to claim 8, wherein determining the correction factor comprises:

subtracting the difference value corresponding to the i−N-th 1 pulse per second signal from the difference value corresponding to the i-th 1 pulse per second signal to generate a reference difference value; and dividing the reference difference value by N to generate the correction factor.

10. The method according to claim 1, wherein the signal generating circuit records a second count value, the clock signal comprises a plurality of pulses, and counting down from the reference count value based on the clock signal comprises:

in response to detecting one of the pulses of the clock signal, decreasing the second count value progressively.

11. A timing receiver, comprising:

a first counter, configured to:

receive a clock signal, and accumulate a first count value based on the clock signal; and in response to receiving an i-th 1 pulse per second signal, output the first count value corresponding to the i-th 1 pulse per second signal, and reset the first counter, wherein i is an index value;

a comparator, coupled to the first counter, obtaining a difference value between a reference value and the first count value corresponding to the i-th 1 pulse per second signal, and storing the difference value to a queue;

the queue, coupled to the comparator, storing a plurality of specific difference values, wherein the specific difference values comprise the difference value corresponding to the i-th 1 pulse per second signal to a difference value corresponding to an i−N+1-th 1 pulse per second signal, and N is a depth of the queue;

an estimation circuit, coupled to the comparator and the queue, generating a reference count value corresponding to the i-th 1 pulse per second signal based on the specific difference values and the reference value; and a signal generating circuit, coupled to the estimation circuit, configured to:

count down from the reference count value based on the clock signal; and in response to determining that the signal generating circuit counts down to a default value, output a corrected 1 pulse per second signal.

12. The timing receiver according to claim 11, wherein the clock signal comprises a plurality of pulses, and the first counter is configured to:

in response to detecting one of the pulses of the clock signal, accumulate the first count value.

13. The timing receiver according to claim 11, wherein the clock signal has a reference frequency, and the reference value is equal to the reference frequency.

14. The timing receiver according to claim 11, further comprising a determining circuit coupled between the first counter and the comparator, configured to:

receive the first count value corresponding to the i-th 1 pulse per second signal from the first counter;

in response to determining that the first count value is between a lower limit and an upper limit, transfer the first count value to the comparator; and in response to determining that the first count value is not between the lower limit and the upper limit, ignore the first count value.

15. The timing receiver according to claim 11, wherein the queue is a first-in-first-out queue.

16. The timing receiver according to claim 11, wherein the estimation circuit is configured to:
   obtain a statistical characteristics value of the specific difference values; and
   add the statistical characteristics value to the reference value to generate the reference count value.

17. The timing receiver according to claim 16, wherein the statistical characteristics value of the specific difference values is an average value of the specific difference values.

18. The timing receiver according to claim 11, wherein the estimation circuit is configured to:
   obtain a reference count value corresponding to an i–1-th 1 pulse per second signal;
   obtain the difference value corresponding to the i-th 1 pulse per second signal and a difference value corresponding to an i–N-th 1 pulse per second signal, and determine a correction factor accordingly; and
   add the correction factor to the reference count value corresponding to the i–1-th 1 pulse per second signal to generate the reference count value corresponding to the i-th 1 pulse per second signal.

19. The timing receiver according to claim 18, wherein the estimation circuit is configured to:
   subtract the difference value corresponding to the i–N-th 1 pulse per second signal from the difference value corresponding to the i-th 1 pulse per second signal to generate a reference difference value; and
   divide the reference difference value by N to generate the correction factor.

20. The timing receiver according to claim 11, wherein the signal generating circuit records a second count value, the clock signal comprises a plurality of pulses, and the signal generating circuit is configured to:
   in response to detecting one of the pulses of the clock signal, decrease the second count value progressively.

\* \* \* \* \*